United States Patent
Lee et al.

(10) Patent No.: US 6,797,618 B2
(45) Date of Patent: Sep. 28, 2004

(54) METHOD FOR FORMING SILICIDE FILM OF A SEMICONDUCTOR DEVICE

(75) Inventors: Eung-Joon Lee, Gyeonggi-do (KR);
In-Sun Park, Gyeonggi-do (KR);
Ji-Soon Park, Gyeonggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/630,570

(22) Filed: Jul. 29, 2003

(65) Prior Publication Data
US 2004/0058500 A1 Mar. 25, 2004

(30) Foreign Application Priority Data
Sep. 24, 2002 (KR) .................. 10-2002-0057884

(51) Int. Cl.[7] .............................................. H01L 21/44
(52) U.S. Cl. ...................... 438/682; 438/660; 438/677; 438/906; 438/963
(58) Field of Search ................. 438/597, 660, 438/661, 663, 664, 677, 679, 681, 682, 906, 963; 134/3; 252/79.1–79.3; 510/175–177

(56) References Cited
U.S. PATENT DOCUMENTS
6,303,503 B1 * 10/2001 Kamal et al. ............... 438/682
2002/0146897 A1 * 10/2002 Nulty et al. ................. 438/586

* cited by examiner

Primary Examiner—David A. Zarneke
Assistant Examiner—Asok Kumar Sarkar
(74) Attorney, Agent, or Firm—Marger Johnson & McCollom, P.C.

(57) ABSTRACT

A conductive pattern having a surface including silicon is formed on a substrate of a semiconductor device and a conduction region having a surface including silicon is formed in the substrate. A radio frequency etching process is performed ex-situ to remove impurities from a resultant structure and to improve surface characteristics of the conduction region. Residues generated during the radio frequency etching process are removed from the conductive pattern and the conduction region by a cleaning process. A metal film is formed on the conductive pattern and the conduction region. A silicide film is formed on the conductive pattern and the conduction region by reacting metal of the metal film and silicon in the conductive pattern and the conduction region. With a radio frequency sputtering process and a wet cleaning process, a metal silicide film having a uniform phase may be stably formed.

14 Claims, 6 Drawing Sheets

METHOD FOR FORMING SILICIDE FILM OF A SEMICONDUCTOR DEVICE

CROSS REFERENCE TO RELATED APPLICATIONS

This application claims priority under 35 USC §119 to Korean Patent Application 2002-57884, filed on Sep. 24, 2002, the contents of which are herein incorporated by reference in their entirety for all purposes.

BACKGROUND OF THE INVENTION

1. Field of the Invention

This disclosure relates to a method for forming a silicide film of a semiconductor device, and more particularly to a method for forming a silicide film of a semiconductor device that can reduce a contact resistance and improve a performance of the semiconductor device.

2. Description of the Related Art

In a rapidly developing information society, highly integrated semiconductor devices having rapid data transmission rates are demanded to more quickly process data. Very minute patterns having a multi-layered structure are also required to fabricate the highly integrated semiconductor device. In these cases, contacts should be formed to electrically connect one pattern with another underlying pattern. As the semiconductor device becomes highly integrated, the window of contact for a connection between the patterns decreases in size. When polysilicon is employed as a material for forming the contact, the contact may have a high contact resistance or a high sheet resistance. As a result, the semiconductor device including the contact may not operate at a high performance speed and may exhibit high power consumption.

To solve the above-mentioned problems, a metal silicide including a compound of metal and silicon has been formed in an active region of a semiconductor device where a contact is formed, for example, source/drains region of the semiconductor device. A process for forming the metal silicide film is referred to as a silicidation process. In the silicidation process, a metal, for example, titanium (Ti), nickel (Ni) or cobalt (Co), is deposited on an underlying layer in the active region, and then is thermally treated so that titanium silicide, nickel silicide, or cobalt silicide can be formed on the underlying layer when silicon exists in the underlying layer. As for a semiconductor device having a design rule of about 0.25 µm, cobalt silicide may be widely used as the metal silicide film because cobalt silicide has a poor dependence on a critical dimension (CD) of a gate of the semiconductor device. For example, U.S. Pat. No. 6,303,503 to Kamal et. al. discloses a method for forming cobalt silicide in an active region of a semiconductor device.

A cobalt silicidation process may be generally performed as follows.

After a region where a cobalt silicide film is positioned is defined in a substrate on which a transistor is formed, a wet cleaning process is executed to remove impurities and a native oxide film on the substrate.

The cleaned substrate is loaded in a chamber of a radio frequency (RF) sputter apparatus. In the radio frequency sputter apparatus, a radio frequency plasma etching process is performed in order to remove from the substrate remaining impurities that may not be completely removed during the wet etching process or a native oxide film that may form again on the substrate during the substrate transfer. The radio frequency process is also performed to improve morphologies of the substrate.

A cobalt film is formed in-situ on the substrate, and the substrate including the cobalt film formed thereon is thermally treated to provide a cobalt silicide film on a gate electrode and in the active region only. The cobalt film may easily make contact with a metal that is successively formed.

However, a process margin for forming the metal silicide film may be extremely reduced since a semiconductor device has a high integration degree as the design rule of the semiconductor device decreases. Thus, the metal silicide film may not be stably formed in an active region of a substrate. For example, an undercut may be generated beneath a gate electrode positioned in a field region of the substrate because an oxide film beneath the gate electrode may be etched by a wet cleaning process for removing remaining impurities or a native oxide film on the substrate. When the substrate is etched using a RF sputtering apparatus, silicon in the gate electrode and the substrate may be sputtered onto a spacer of the gate electrode and the undercut beneath the gate electrode. As a result, silicon remains in an insulation region of the substrate. In case that a silicidation process is performed for forming the metal silicide film on a resultant structure formed on the substrate, the metal silicide film is formed on the spacer and beneath the gate electrode, thereby causing a short failure of a semiconductor device. When a self-aligned contact (SAC) pad is formed, or a mis-alignment is generated during a formation of a contact hole, a short of the semiconductor device may be caused due to the metal silicide film positioned on the spacer. Additionally, a leakage current or an electrical short may be caused due to the metal silicide film formed along gate electrodes when the gate electrodes are formed in the active and field regions.

Embodiments of the invention address these and other disadvantages of the conventional art.

SUMMARY OF THE INVENTION

Embodiments of the invention form a stable and uniform metal silicide film on the source/drain regions and gate electrodes of the transistors using radio frequency sputtering and wet cleaning processes. As a result, the contact resistance due to the metal silicide film can be reduced to provide a high operation speed of a semiconductor device and an improved performance of the semiconductor device.

BRIEF DESCRIPTION OF THE DRAWINGS

The above and other objects and advantages of the invention will become readily apparent by reference to the following detailed description when considered in conjunction with the accompanying drawings.

DETAILED DESCRIPTION OF THE INVENTION

Figure 1:
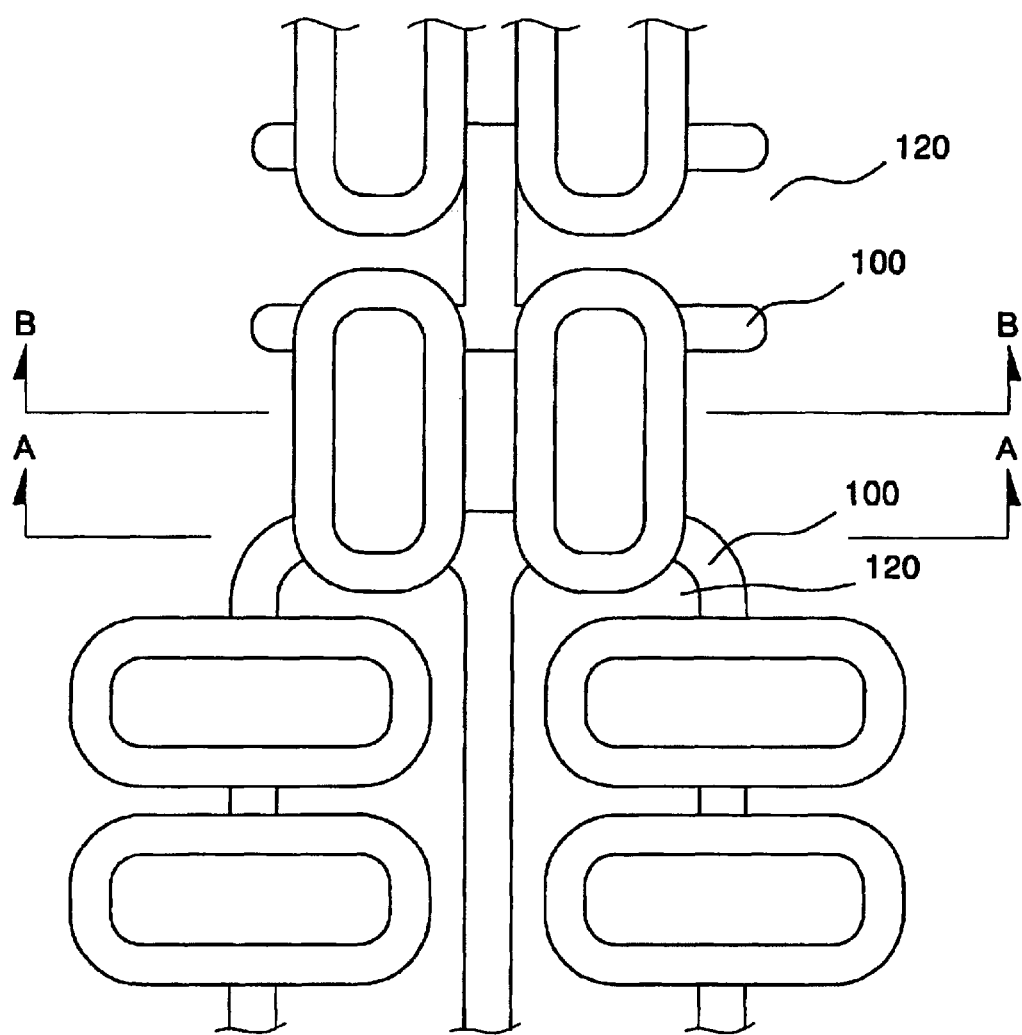
FIG. 1 is a plan diagram illustrating a semiconductor device according to an embodiment of the invention.

A method for forming a silicide film in accordance with embodiments of the invention will first be described in a general way and without use of the FIGURES, in order to provide an overview of the invention. After that, embodiments of the invention will be described with reference to the accompanying drawings.

A conductive film whose surface includes silicon is formed on a semiconductor substrate, and a conduction region whose surface also includes silicon is formed in the semiconductor substrate. For example, the conduction region corresponds to an active region. A silicidation blocking layer may be selectively formed in the conductive region of the semiconductor substrate. In addition, a native oxide film may be formed on a resultant structure positioned on the substrate, and the native oxide film can be removed using a rinsing solution including hydrofluoric acid (HF).

To remove impurities on the resultant structure and to improve a topology of a surface of the conduction region including silicon, the substrate having the resultant structure is etched ex-situ by a radio frequency plasma etching process. The radio frequency etching process is executed with a direct current (DC) bias voltage of below about −100V so that the silicon has a uniform amorphous phase. At this time, the radio frequency etching process is performed under an argon gas atmosphere in order to prevent the silicon from being etched again.

Residues on the resultant structure and the substrate, generated during the radio frequency etching process, are removed from the resultant structure and the substrate by a cleaning process. The cleaning process is performed using a composition of a hydrofluoric acid solution and an ammonia solution to remove a native oxide film and sputtered silicon from the resultant structure and the substrate.

A metal film is deposited on the cleaned resultant structure. The metal film may include cobalt (Co), tungsten (W) or nickel (Ni). An oxidation blocking layer including titanium nitride (TIN) may be formed on the metal film.

A silicide film is formed on the resultant structure and the substrate in accordance with a reaction between metal and silicon. The silicide film is formed through two heat treatments while un-reacted metal is removed from the resultant structure and the substrate after the reaction between metal and silicon. Here, the un-reacted metal can be removed using a solution that includes hydrogen peroxide and sulfuric acid.

Meanwhile, an active region and a field region are defined in a semiconductor substrate, and gate electrodes are formed in the active and field regions.

Source/drain regions are formed beneath sides of the gate electrodes in the active region by an ion implantation process, and spacers are formed on sidewalls of the gate electrodes, respectively.

A resultant structure on the substrate and the substrate are etched ex-situ by a radio frequency etching process to provide silicon in the source/drain regions having uniformly amorphous phase.

The substrate including the resultant structure is cleaned to remove residues generated during the radio frequency etching process from the substrate and the resultant structure.

A metal film and an oxidation blocking film are formed on the resultant structure, and a primary heat treatment is performed on the metal film of the resultant structure. Thus, a silicide film is formed on the resultant structure in accordance with a reaction between metal in the metal film and silicon in an underlying film.

Un-reacted metal and the oxidation blocking layer are removed, and the silicide film is thermally treated by a secondary heat treatment to stabilize the silicide film and to reduce a resistance in the silicide film.

Hereinafter, the embodiments of the present invention will be described in detail with reference to the accompanying drawings. In the following drawings, like reference numerals identify similar or identical elements.

FIG. 1 is a plan view illustrating a semiconductor device according to an embodiment of the invention, and FIGS. 2A to 2H are cross-sectional views illustrating manufacturing steps for a semiconductor device according to an embodiment of the invention.

Figure 2A:
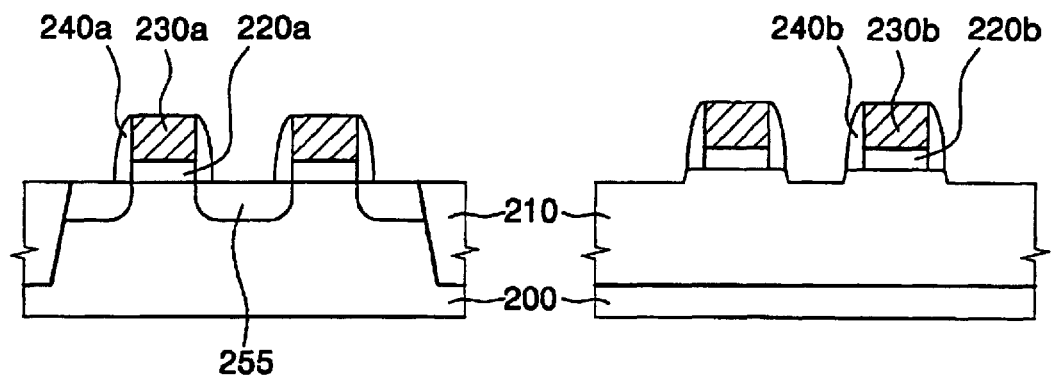
FIGS. 2A to 2H are cross-sectional diagrams illustrating manufacturing steps for a semiconductor device according to an embodiment of the invention.

Referring to FIGS. 1 and 2A, a field oxide film 210 is formed on a silicon substrate 200 by a shallow trench isolation (STI) process to define an active region 100 and a field region 120 of the substrate 200.

An oxide film and a polysilicon film are formed on the substrate 200, and the polysilicon film is highly doped with impurities to have a high n-type concentration.

A photoresist film is coated on the polysilicon film, and the photoresist film is patterned to form a photoresist pattern exposing portions of the polysilicon film pattern by a photolithography process.

After the polysilicon and the oxide films are etched to expose portions of the substrate 200 using the photoresist pattern as an etching mask, the photoresist pattern is removed to provide a first gate oxide film 220a, a second gate oxide film 220b, a first gate electrode 230a, and a second gate electrode 230b. Here, the gate electrodes 230a and 230b are formed from the active region 100 to the field region 120 of the substrate 200. Thus, as shown in FIG. 1, the gate electrodes 230a and 230b can be divided into the first gate electrode 230a positioned in the active region 100 of the substrate 200 along a direction of "A", and the second gate electrode 230b formed in the field region 210 of the substrate 200 along a direction of "B".

Source/drain regions 255 are formed in portions of the substrate 200 near both sides of the first gate electrode 230a by an ion implantation process.

An insulation film including silicon oxy-nitride or silicon nitride is formed on the first and second gate electrodes 230a and 230b and on the substrate 200. Then, the insulation film is anisotropically etched to provide a first gate spacer 240a on a sidewall of the first gate electrode 230a, and a second gate spacer 240b on a sidewall of the second gate electrode 230b. In this case, the field oxide film 210 is partially etched during etching the insulation film because the field oxide film 210 includes a material similar to that of the insulation film. Thus, the second gate electrode 230b formed on the field oxide film 210 is protruded relative to the first gate electrode 230a from the substrate 200.

Figure 2B:
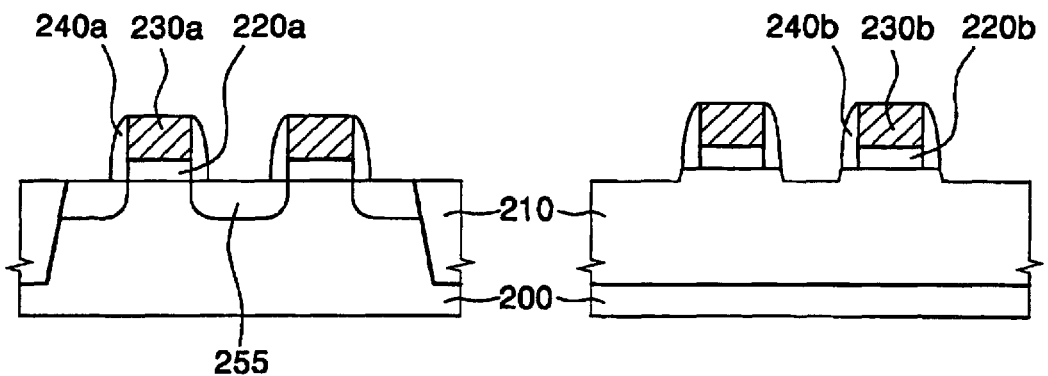

Referring to FIG. 2B, a buffer layer and a silicidation blocking layer (SBL) are formed on a surface of the substrate 200 including the gate electrodes 230a and 230b. The buffer layer can prevent the silicon substrate 200 and the field oxide film 210 from being etched when the SBL is etched. With a photolithography process, an SBL pattern (not shown) is formed in a region of the substrate 200 where a silicide film cannot be demanded in order to prevent a silicidation of the substrate 200. The gate electrode 230a and source/drain regions 255 are exposed by the SBL pattern in a region of the substrate 200 where an electric signal speed can be relatively high. A native oxide film formed on the resultant structure during the above-described process can be removed using a rinsing solution including hydrofluoric (HF) acid. However, the native oxide film may be formed on the resultant structure, and also impurities including polymer residues may be formed on the resultant structure while the above-described process is performed. Those impurities may be hardly removed using a wet etching process. In the meantime, the surface of the substrate 200 may be damaged during the formations of the source/drain regions 255 by the ion implantation process. When a metal film and a silicide film are formed on the source/drain regions 255 during successive processes, the metal and silicide films may not be uniformly formed on the source/drain regions 255 due to the native oxide film or the impurities. As a result, the metal and silicide films may be partially broken so that a processing failure for manufacturing a semiconductor device may be caused or a semiconductor device including those metal and silicide films may have poor electrical properties.

To remove those impurities and to achieve uniform amorphousness of surfaces of the source/drain regions 255, the substrate 200 including the source/drain regions 255 can be treated ex-situ by a radio frequency (RF) sputtering process. Thus, the remaining impurities on the surfaces of the source/drain regions 255 can be removed during the formation of the source/drain regions 255 having amorphous phases. In this case, the substrate 200 including the source/drain regions 255 can be treated ex-situ using a low voltage bias of below about -100V to prevent the source/drain regions 255 from being damaged. In addition, the substrate 200 can be treated under an argon (Ar) gas atmosphere during the RF sputtering process in order to minimize a contamination of an insulation region of the substrate 200 caused by re-sputtering silicon from a conduction region of the substrate 200 including the gate electrodes 230a and 230b and the source/drain regions 255 to the insulation region of the substrate 200.

Figure 2C:
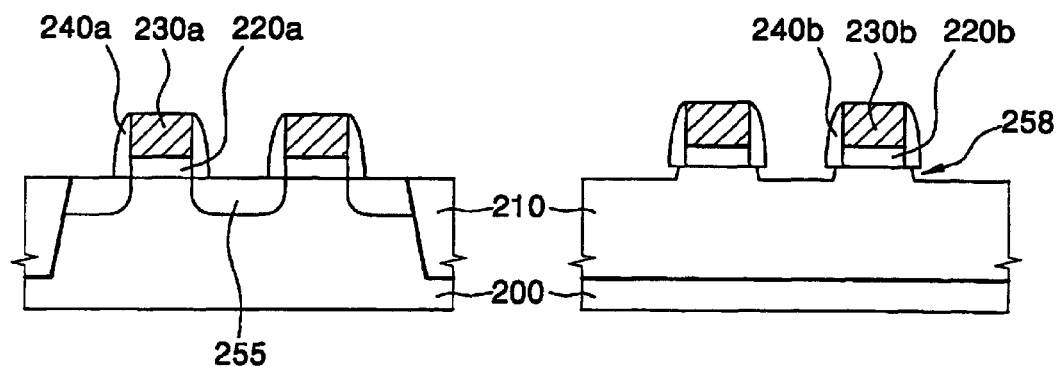

Referring to FIG. 2C, though the argon gas atmosphere can minimize the re-sputtering of the silicon, the argon gas may not completely prevent the silicon from re-sputtering. When the silicon is re-sputtered from the source/drain regions 255 to an adjacent gate spacer formed on the sidewall of the gate electrode, the gate spacer may have an electrical conductivity during a successive silicidation process. As a result, a short failure may be generated between adjacent gate electrodes. Therefore, the resultant structure is cleaned by a wet cleaning process to remove the re-sputtered silicon and the oxide. At this time, the wet cleaning process can be executed with a rinsing solution including a hydrofluoric acid solution and an SC-1 solution including $NH_4OH$, $H_2O_2$, and $H_2O$ by a ratio of about 1:1:5 since the oxide can be removed using the hydrofluoric acid solution, and the silicon can be removed using an ammonia hydroxide solution. However, the rinsing solution may etch the field oxide film 210 during cleaning of the re-sputtered silicon and oxide so that an under cut 258 may be formed under the second gate spacer 240b in accordance with the consumption of the field oxide film 210 beneath the second gate electrode 230b.

Figure 2D:
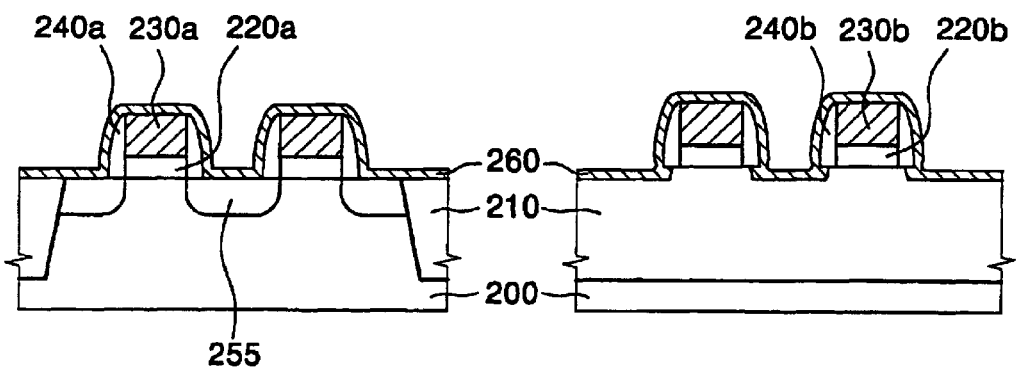

Referring to FIG. 2D, a metal film is formed on the resultant structure by depositing a metal on the resultant structure. The metal film can include cobalt (Co), titanium (Ti), tungsten (W), or nickel (Ni). Preferably, a cobalt film 260 is formed on the resultant structure.

An oxidation preventing film including titanium nitride (TiN) is formed on the cobalt film 260 to prevent the cobalt film 260 from being oxidized. When an oxide film is formed on the cobalt film 260, cobalt silicide may not be formed on the cobalt film 260 so that a silicide film may not be formed at a predetermined portion of the cobalt film 260. However, the oxide film is not formed on the cobalt film 260 in the case where the oxidation preventing film is positioned on the cobalt film 260.

Figure 2E:
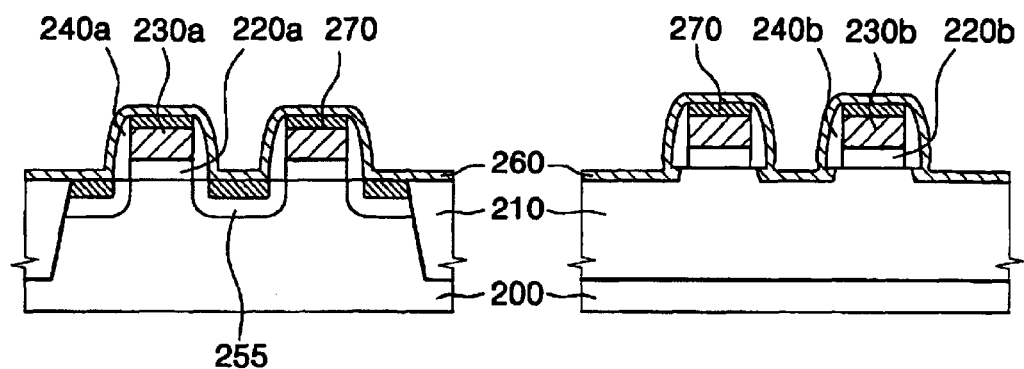

Referring to FIG. 2E, the cobalt in the cobalt film 260 is downwardly diffused by a first rapid thermal process. In this case, the cobalt of the cobalt film 260 may be reacted with the silicon in the gate electrodes 230a and 230b and the source/drain regions 255 exposed through the SBL pattern to provide a cobalt silicide film 270 on the gate electrodes 230a and 230b and on the source/drain regions 255. That is, the cobalt of the cobalt film 260 can be reacted with the silicon to form the cobalt silicide film 270 when the silicon exists beneath the cobalt film 260. Thus, the cobalt film 260 can intrinsically remain on the SBL pattern, the gate spacers 240a and 240b, and the field oxide film 210 without the reaction between the cobalt and the silicon because the silicon does not exist in the SBL pattern, the gate spacers 240a and 240b, and the field oxide film 210.

Figure 2F:
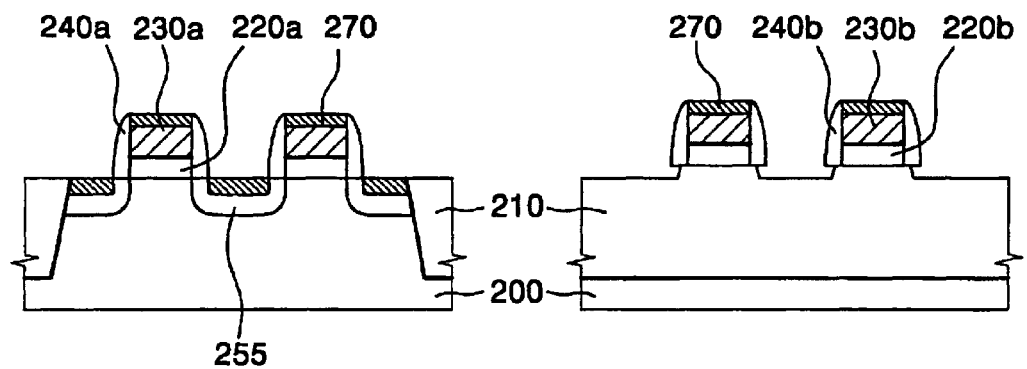

Referring to FIG. 2F, undesired remaining cobalt in the cobalt film 260 that is not reacted with the silicon is removed, and then the cobalt silicide film 270 is thermally stabilized by a second rapid thermal process performed at a temperature higher than that of the first rapid thermal process.

Figure 2G:
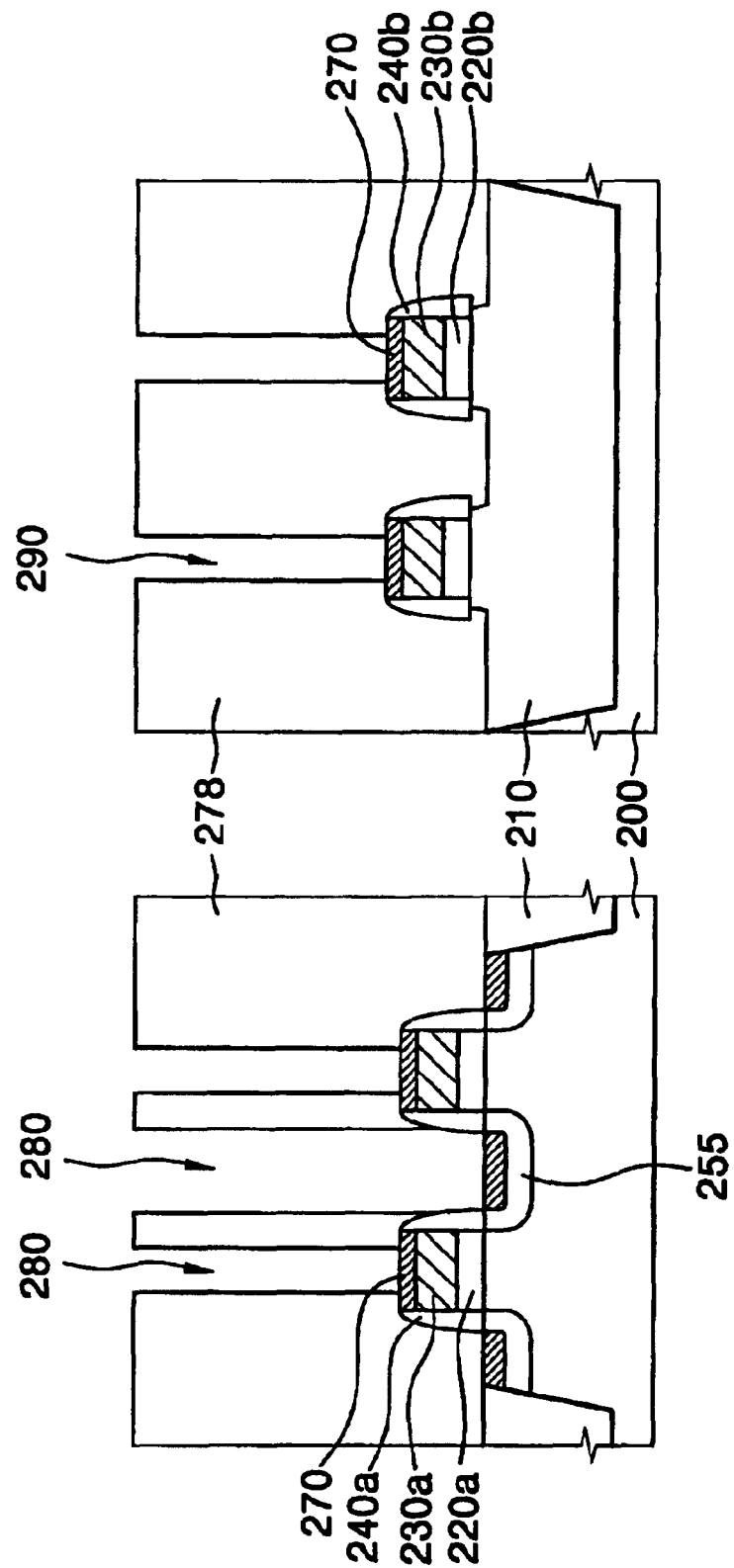

Referring to FIG. 2G, an insulation film 278 is formed on the resultant structure. The insulation film 278 is selectively etched to expose portions of the first gate electrode 230a, the source/drain regions 255, and the second gate electrode 230b. As a result, first contact holes 280 are formed in the active region 100 of the substrate 200, and second contact holes 290 are formed in the field region 120 of the substrate 200. The first and the second contact holes 280 and 290 expose portions of the silicide film 270 positioned on the source/drain region 250, and the first and second electrodes 230a and 230b, respectively.

Figure 2H:
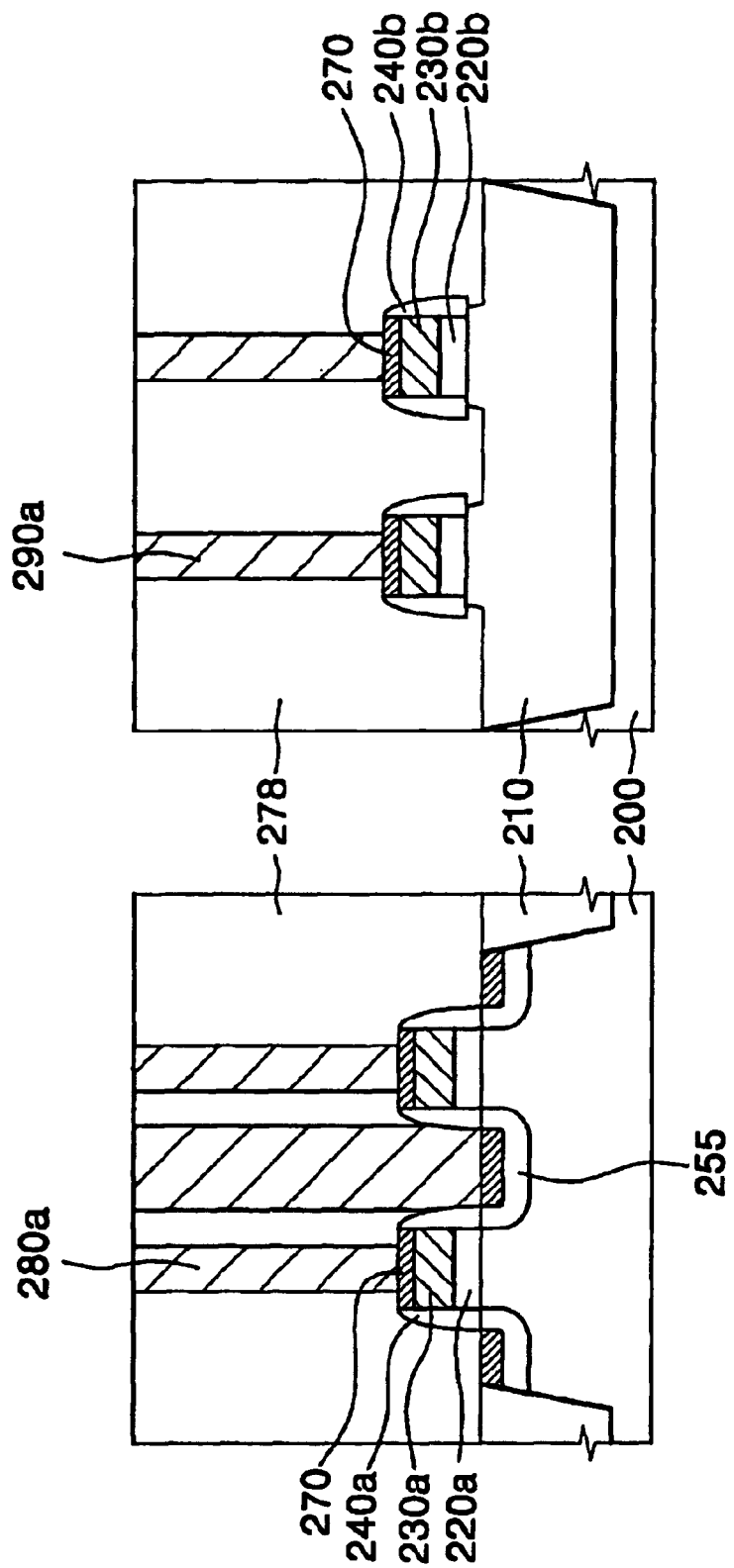

Referring to FIG. 2H, a metal film is formed on the insulation film 278 to fill up the first and second contact holes 280 and 290. The metal film is polished using a chemical-mechanical polishing (CMP) process until the insulation film 278 is exposed to provide first contact plugs 280a and second contact plugs 290a. The first and second contact plugs 280a and 290a fill up the first and second contact holes 280 and 290, respectively. In addition, the first and second contact plugs 280a and 290a are in contact with the silicide film 270.

In the case where the semiconductor device includes the first and second contact plugs 280a and 290a in contact with the silicide film 270, a failure caused by remaining impurities on the silicide film 270 can be prevented during a fabrication of the semiconductor device. In addition, the semiconductor device can have desired electric properties due to the silicide film 270 being uniformly formed on the gate electrodes 230a and 230b, and on the source/drain regions 255. Furthermore, a standard by current (Isb) of the semiconductor device including the silicide film 270 may have a value that is about ten times lower than that of the conventional semiconductor device.

According to embodiments of the invention, after a structure including transistors is formed on a semiconductor device, source/drain regions of the transistors that are irregularly formed during an ion implantation process are etched ex-situ by a radio frequency sputtering process to have uniformly amorphous phases while remaining impurities on the structure are removed. Re-sputtered silicon generated from the radio frequency sputtering process is removed using a wet cleaning process.

With a radio frequency sputtering and a wet cleaning processes, a metal silicide film can be stably and uniformly formed on the source/drain regions and gate electrodes of the transistors. As a result, a contact resistance can be reduced due to the metal silicide film to provide a high operation speed of the semiconductor device and an improved performance of the semiconductor device.

Thus, embodiments of the invention provide a method of forming a silicide film of a semiconductor device that reduces a contact resistance, prevents short failures, and improves the performance of the semiconductor device. Embodiments of the invention will now be described in a non-limiting way.

According to an embodiment of the invention, a conductive pattern whose surface includes silicon is formed on a substrate, and a conduction region having a surface including silicon is formed in the substrate. A radio frequency etching process is performed ex-situ to remove impurities from the conductive pattern and the conduction region, and to provide the conduction region having a uniform surface. Residues generated during the radio frequency etching are removed from the conductive pattern and the conduction region by a cleaning process using a composition including hydrofluoric acid and ammonia to remove a native oxide film and sputtered silicon. A metal film including cobalt (Co), tungsten (W) or nickel (Ni) is formed on the conductive pattern and the conduction region, and a silicide film is formed on the conductive pattern and the conduction region by reacting metal of the metal film with silicon in the conductive pattern and the conduction region. In this case, the radio frequency etching process is performed with a low voltage of below about −100V under an argon gas atmosphere to provide (the silicon having a uniformly amorphous phase) and to minimize a re-etching of the silicon.

According to another embodiment of the invention, an active region and a field region are defined in a semiconductor substrate, and gate electrodes are formed in the active and field regions. Source/drain regions are formed between the gate electrodes in the active region by an ion implantation process, and spacers are formed on sidewalls of the gate electrodes, respectively. A radio frequency etching process is performed ex-situ concerning a resultant structure on the substrate to provide silicon in the source/drain regions having a uniformly amorphous phase. Residues generated during the radio frequency etching are removed using a cleaning process. A metal film and an oxidation blocking film are formed on the resultant structure. A primary heat treatment is performed for metal of the metal film and silicon of the resultant structure to form a silicide film on the resultant structure, and un-reacted metal and the oxidation blocking film are removed. A secondary heat treatment is performed for the silicide film to reduce a resistance of the silicide film and to stabilize the silicide film.

Having described several exemplary embodiments of the invention, it is noted that various modifications may be made by persons skilled in the art in light of the above teachings. It is therefore to be understood that changes may be made to the particular embodiments of the invention disclosed above that are within the scope and the spirit of the invention as defined by the following appended claims.

What is claimed is:

1. A method for forming a silicide film of a semiconductor device comprising:
   forming a conductive pattern whose surface includes silicon on a substrate:
   forming a conduction region whose surface includes silicon in the substrate;
   performing a radio frequency etching process ex-situ that removes impurities from the conductive pattern and the conduction region on the substrate and that uniformly planarizes a surface of the conduction region;
   performing a cleaning process that removes residues generated during the radio frequency etching process from the conductive pattern and the conduction region;
   forming a metal film on the conductive pattern and the conduction region; and
   forming a silicide film on the conductive pattern and the conduction region by reacting a metal of the metal film and silicon in the conductive pattern and the conduction region.

2. The method of claim 1, wherein performing a radio frequency etching process comprises performing the radio frequency etching process with a low voltage of below about −100V that provides the silicon with a uniformly amorphous phase.

3. The method of claim 1, wherein performing a radio frequency etching process comprises performing the radio frequency etching process under an argon gas atmosphere that minimizes a re-etching of the silicon.

4. The method of claim 1, wherein performing a cleaning process comprises performing the cleaning process using a composition including hydrofluoric acid and ammonia to remove a native oxide film and sputtered silicon.

5. The method of claim 1, further comprising removing a native oxide film using a solution including hydrogen fluoric acid before performing the radio frequency etching process.

6. The method of claim 1, wherein the conduction region corresponds to an active region of the semiconductor device.

7. The method of claim 1, wherein the metal film comprises a material selected from the group consisting of cobalt (Co), tungsten (W), and nickel (Ni).

8. The method of claim 1, further comprising forming a silicidation blocking layer on the conductive pattern and the conduction region.

9. The method of claim 1, further comprising forming an oxidation blocking layer on the metal film.

10. The method for of claim 9, wherein forming an oxidation blocking layer on the metal film comprises forming a titanium nitride (TiN) layer on the metal film.

11. The method of claim 1, wherein forming a silicide film on the conductive pattern and the conduction region comprises forming the silicide film on the conductive pattern and the conduction region using two heat treatments.

12. The method of claim 1, further comprising:
   reacting the metal with the silicon; and
   removing the metal that does not react with the silicon.

13. The method of claim 12, wherein removing the metal that does not react with the silicon comprises removing the metal that does not react with the silicon using a composition including hydrogen peroxide and sulfuric acid.

14. A method for forming a semiconductor device comprising:
   defining an active region and a field region in a semiconductor substrate;
   forming gate electrodes in the active and field regions;
   forming source/drain regions between the gate electrodes in the active region using an ion implantation process;
   forming spacers on sidewalls of the gate electrodes;
   performing a radio frequency etching process ex-situ on a resultant structure on the substrate that provides silicon in the source/drain regions having a uniformly amorphous phase;
   performing a cleaning process that removes residues generated during the radio frequency etching process;
   forming a metal film and an oxidation blocking film on the resultant structure;
   forming a silicide film on the resultant structure by using a primary heat treatment on the metal of the metal film and the silicon of the resultant structure;
   removing un-reacted metal and the oxidation blocking film; and
   reducing a resistance of the silicide film and stabilizing the silicide film by using a secondary heat treatment on the silicide film.

* * * * *